United States Patent
Yang et al.

(10) Patent No.: US 6,790,742 B2
(45) Date of Patent: Sep. 14, 2004

(54) CHEMICAL MECHANICAL POLISHING IN FORMING SEMICONDUCTOR DEVICE

(75) Inventors: Ming-Sheng Yang, Hsin-Chu (TW); Juan-Yuan Wu, Hsinchu (TW); Water Lur, Taipei (TW)

(73) Assignee: United Microelectronics Corporation, San Francisco, CA (US)

( * ) Notice: Subject to any disclaimer, the term of this patent is extended or adjusted under 35 U.S.C. 154(b) by 0 days.

(21) Appl. No.: 10/293,243

(22) Filed: Nov. 13, 2002

(65) Prior Publication Data

US 2003/0129808 A1 Jul. 10, 2003

Related U.S. Application Data (60) Continuation-in-part of application No. 09/991,395, filed on Nov. 20, 2001, now Pat. No. 6,486,040, which is a continuation of application No. 09/692,251, filed on Oct. 19, 2000, now Pat. No. 6,448,159, which is a division of application No. 09/111,007, filed on Jul. 7, 1998, now Pat. No. 6,169,012.

(30) Foreign Application Priority Data

Jun. 3, 1998 (TW) .................................. 87108699 A (51) Int. Cl.⁷ .................................................. H01L 21/76
(52) U.S. Cl. ...................... 438/401; 438/424; 438/427; 438/692
(58) Field of Search .................................. 438/401, 404, 438/242, 427, 462, 690–693, 778, 787, 791, 424

(56) References Cited

U.S. PATENT DOCUMENTS 4,755,050 A    7/1988 Watkins 5,459,096 A    10/1995 Venkatesan et al.
5,498,565 A    3/1996 Gocho et al.

(List continued on next page.)

FOREIGN PATENT DOCUMENTS

| EP | 0 712 156 A2 | 5/1996 |
| EP | 0 712 156 A3 | 11/1997 |
| JP | 60283995 | 6/1987 |

OTHER PUBLICATIONS

Liu, George Y., Zhang, Ray F., Hsu, Kelvin, Camilletti, Lawrence, Chip–Level CMP Modeling and Smart Dummy for HDP and Conformal CVD Films, CMP Technology, Inc., and Rockwell Semiconductor, p. 8, no date.

Primary Examiner—Kevin M. Picardat
(74) Attorney, Agent, or Firm—Peter J. Meza; William J. Kubida; Hogan & Hartson LLP (57) ABSTRACT

A method of chemical-mechanical polishing for forming a shallow trench isolation is disclosed. A substrate having a number of active regions, including a number of relatively large active regions and a number of relative small active regions, is provided. The method comprises the following steps. A silicon nitride layer on the substrate is formed. A number of shallow trenches are formed between the active regions one or more of which may constitute an alignment mark. An oxide layer is formed over the substrate, so that the shallow trenches are filled with the oxide layer. A partial reverse active mask is formed on the oxide layer. The partial reverse active mask exposes a portion of the oxide layer over the large active area and over the alignment mark. The oxide layer of each large active region and the alignment mark is removed. The partial reverse active mask is removed. The oxide layer is planarized.

23 Claims, 5 Drawing Sheets

U.S. PATENT DOCUMENTS

| | | | |
|---|---|---|---|
| 5,626,913 A | 5/1997 | Tomoeda et al. | |
| 5,792,707 A | 8/1998 | Chung | |
| 5,837,612 A | 11/1998 | Ajuria et al. | |
| 5,854,133 A | 12/1998 | Hachiya et al. | |
| 5,858,842 A | 1/1999 | Park | |
| 5,885,856 A | 3/1999 | Gilbert et al. | |
| 5,885,886 A | 3/1999 | Lee | |
| 5,893,744 A * | 4/1999 | Wang | 438/401 |
| 5,902,752 A | 5/1999 | Sun et al. | |
| 5,911,110 A | 6/1999 | Yu | |
| 5,923,993 A | 7/1999 | Sahota | |
| 5,926,723 A | 7/1999 | Wang | |
| 5,948,573 A | 9/1999 | Takahashi | |
| 5,958,795 A | 9/1999 | Chen et al. | |
| 5,965,941 A | 10/1999 | Weling et al. | |
| 5,998,279 A * | 12/1999 | Liaw | 438/424 |
| 6,004,863 A | 12/1999 | Jang | |
| 6,013,558 A | 1/2000 | Harvey et al. | |
| 6,020,616 A | 2/2000 | Bothra et al. | |
| 6,043,133 A * | 3/2000 | Jang et al. | 438/401 |
| 6,087,733 A | 7/2000 | Maxim et al. | |
| 6,117,622 A | 9/2000 | Eisele et al. | |
| 6,169,012 B1 | 1/2001 | Chen et al. | |
| 6,184,104 B1 | 2/2001 | Tan et al. | |
| 6,194,287 B1 * | 2/2001 | Jang | 438/427 |
| 6,215,197 B1 * | 4/2001 | Iwamatsu | 257/797 |
| 6,259,115 B1 | 7/2001 | You et al. | |
| 6,326,309 B2 | 12/2001 | Hatanaka et al. | |
| 6,603,612 B2 | 8/2003 | Nakano | |

\* cited by examiner

CHEMICAL MECHANICAL POLISHING IN FORMING SEMICONDUCTOR DEVICE

CROSS-REFERENCE TO RELATED APPLICATIONS

This application is a continuation-in-part of U.S. patent application Ser. No. 09/991,395, filed Nov. 20, 2001, now U.S. Pat. No. 6,486,040 which is a continuation of U.S. patent application Ser. No. 09/692,251, filed Oct. 19, 2000, now U.S. Pat. No. 6,448,159, which is a divisional of U.S. patent application Ser. No. 09/111,007 filed Jul. 7, 1998, now U.S. Pat. No. 6,169,012, which claims priority from Taiwan Application No. 87108699, filed Jun. 3, 1998, all the disclosures of which are herein specifically incorporated by this reference.

BACKGROUND

1. Field of Invention

This invention relates to a chemical mechanical polishing (CMP) applied in forming shallow trench isolation (STI), and more particularly, to a process of forming a STI structure combining CMP, using a partial reverse active mask.

2. Background

CMP is a technique ideal for applying in global planarization in very large scale integration (VLSI) and even in ultra large-scale integration (ULSI). Moreover, CMP is likely to be the only reliable technique as the feature size of the integrated circuit (IC) is highly reduced. Therefore, it is of great interest to develop and improve CMP techniques to reduce costs.

As the IC devices are continuously sized down to a linewith of 0.25 μm or even 0.18 μm (deep sub-half micron), using CMP to planarize the wafer surface, especially to planarize the oxide layer on the surface of the shallow trench, becomes even more important. To prevent the dishing effect occurring at the surface of a larger trench during CMP process and to obtain a superior CMP uniformity, a reverse tone active mask was proposed, in cooperation with an etching back process.

Figure 1A:
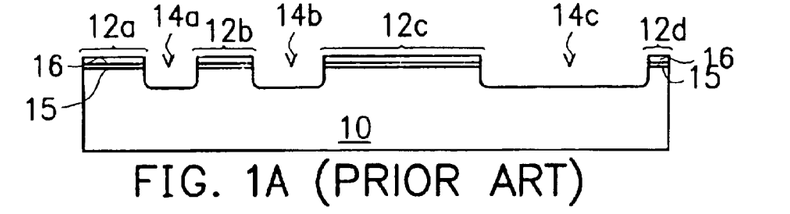
FIGS. 1A to 1E are cross-sectional views showing the process steps of forming a conventional shallow trench using a reverse active mask.

Typically, the active regions have varied sizes and the shallow trenches between the active regions also have different sizes. FIGS. 1A to 1E are cross sectional views showing the process steps for forming shallow trench isolation, using CMP. Referring to FIG. 1A, on a substrate 10, a pad oxide 15 and a silicon nitride layer 16 are deposited successively. By photolithography, the substrate 10, the pad oxide layer 15 and the silicon nitride layer 16 are anisotropically etched to form shallow trenches 14a, 14b, 14c and define active regions 12a, 12b, 12c, 12d. The sizes of the shallow trenches 14a, 14b, 14c are different since the sizes of the active regions 12a, 12b, 12c, 12d are varied.

Figure 1B:
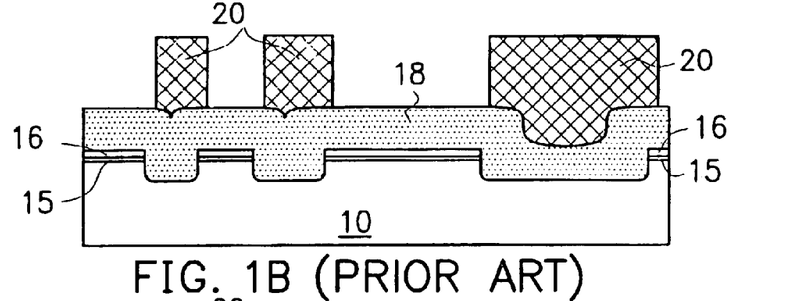

Next, referring to FIG. 1B, an oxide layer 18 is deposited by atmosphere pressure chemical vapor deposition (APCVD) on a substrate 10 to fill the interior of the shallow trenches 14a, 14b, 14c. However, due to the step coverage of the oxide layer 18, the deposited oxide layer 18 has an uneven surface and a rounded shape. Then, a photoresist layer is coated on the surface of the oxide layer 18 and patterned to form a reverse active mask 20 by photolithography. The reverse active mask 20 covers the shallow trenches 14a, 14b, 14c and is complementary to the active regions 12a, 12b, 12c, 12d. However, during the formation of the reverse active mask, misalignment causes the oxide layer 18 to cover more than the shallow trenches 14a, 14b, 14c.

Figure 1C:
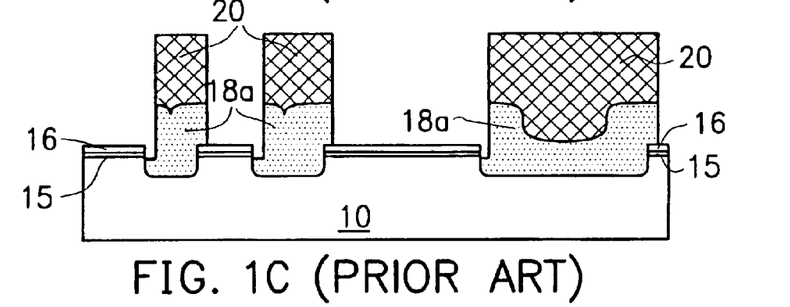
Figure 1D:
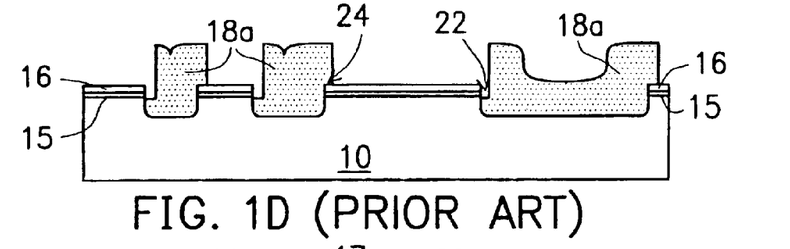

Referring to FIG. 1C, the oxide layer 18 exposed outside the reverse active mask 20 is etched until the silicon nitride layer 16 is exposed so that only a part of the silicon oxide layer 18, the silicon oxide layer 18a, is formed. After removing the reverse active mask 20, as shown in FIG. 1D, it is observable that the silicon oxide layer 18a remained does not fully cover the shallow trenches 14a, 14b, 14c at one sides of the shallow trenches 14a, 14b, 14c, therefore, forming cavities 22, but at the other sides over-cover the shallow trenches 14a, 14b, 14c, forming photo-overlap 24.

Figure 1E:
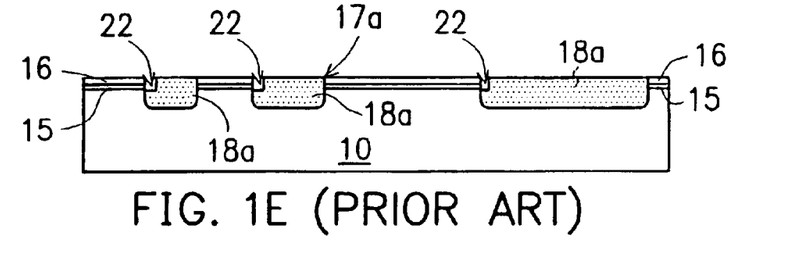

Referring to FIG. 1E, the portion of the oxide layer 18a higher than the shallow trenches 14a, 14b, 14c is polished by CMP until the surface of the silicon nitride layer 16 is exposed. Therefore, the silicon nitride layer 16 and the silicon oxide layer 18a are at the same level. The profile of the silicon oxide layer 18a formed by APCVD is rather rounded and the APCVD silicon oxide layer 18a is hard to planarize. Moreover, it is obvious that the silicon oxide layer 18a does not fully fill the shallow trenches 14a, 14b, 14c but forms the concaves 22. The undesired concaves 22 may cause kink effect and consequent short circuit or leakage current which therefore influence the yield.

As a result, it is important to overcome the problems coming after the formation of the concaves due to the misalignment of the reverse active mask during the process of CMP, especially, while nowadays the linewidth is decreasing.

SUMMARY OF THE INVENTION

It is therefore an objective of the present invention to provide a method of chemical-mechanical polishing for forming a shallow trench isolation. A substrate having a number of active regions, including a number of relative large active regions and a number of relative small active regions, is provided. The method comprises the following steps. A silicon nitride layer on the substrate is first formed. A number of shallow trenches are formed between the active regions. An oxide layer is formed over the substrate, so that the shallow trenches are filled with the oxide layer. A partial reverse active mask is formed on the oxide layer. The partial reverse active mask has an opening at a central part of each relative large active region. The opening exposes a portion of the oxide layer. The opening has at least a dummy pattern. The oxide layer on the central part of each large active region is removed to expose the silicon nitride layer. The partial reverse active mask is removed. The oxide layer is planarized to expose the silicon nitride layer.

In one aspect, the invention provides a method of chemical-mechanical polishing for forming a shallow trench isolation, wherein a substrate having a plurality of active regions, including a plurality of relatively large active regions and a plurality of relatively small active regions and an alignment mark. The method comprises: forming a plurality of shallow trenches between the active regions; forming an oxide layer over the substrate, so that the shallow trenches and the alignment mark are filled therewith; forming a partial reverse active mask on the oxide layer, wherein the partial reverse active mask has an opening at each relatively large active region and at the alignment mark when the reverse active mask completely covers each relatively small active region and trenches, wherein the opening exposes a portion of the oxide layer; removing portions of the oxide layer on each large active region and at the alignment mark; removing the partial reverse active mask; and planarizing the oxide layer.

In another aspect, the invention provides a method of chemical-mechanical polishing in forming a multi-layered semiconductor device comprising a substrate. The method comprises forming an alignment mark in the substrate and a plurality of shallow trenches between active regions of the semiconductor substrate; forming an oxide layer over the substrate; forming a partial reverse active mask on the oxide layer, wherein the partial reverse active mask has an opening over a portion of at least one active region and over the alignment mark; removing portions of the oxide layer over at least one active region and over portions of the alignment mark to expose a portion of the oxide layer; removing the partial reverse active mask; and planarizing the oxide layer.

In yet another aspect, the invention provides a method of forming a semiconductor device having an alignment mark. The method comprises forming an alignment mark in a substrate; forming at least one active area on the substrate; forming an oxide layer over the substrate, wherein the oxide layer covers at least a portion of the alignment mark; forming a partial reverse active mask on the oxide layer, wherein the partial reverse active mask has an opening over at least a portion of the alignment mark; removing portions of the oxide layer to expose a portion of the oxide layer; removing the partial reverse active mask; and planarizing the oxide layer.

BRIEF DESCRIPTION OF THE DRAWINGS

The invention can be more fully understood by reading the following detailed description of the preferred embodiments, with reference made to the accompanying drawings, wherein.

DETAILED DESCRIPTION OF THE PREFERRED EMBODIMENTS

The invention provides a process for forming STI, combining the partial reverse active mask and CMP, using high density plasma chemical vapor deposition (HDCVD). This process prevents the formation of concaves in the shallow trenches due to the misalignment of the reverse active mask, which consequently causes short circuit or leakage current. In another embodiment, a partial active reverse mask technique is used to permit oxide to be etched from an alignment mark in the substrate.

Figure 2A:
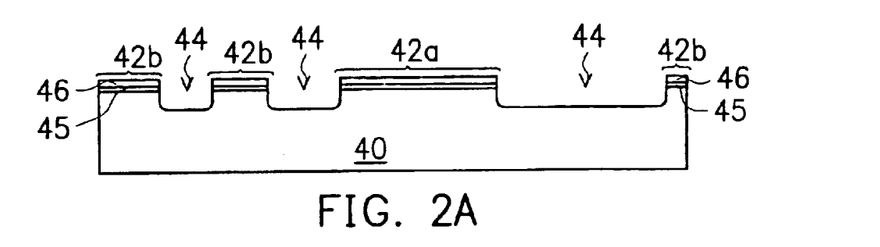
FIGS. 2A to 2E are cross-sectional views showing the process steps of forming shallow trenches using a partial reverse active mask according to a preferred embodiment of the invention.
Figure 2B:
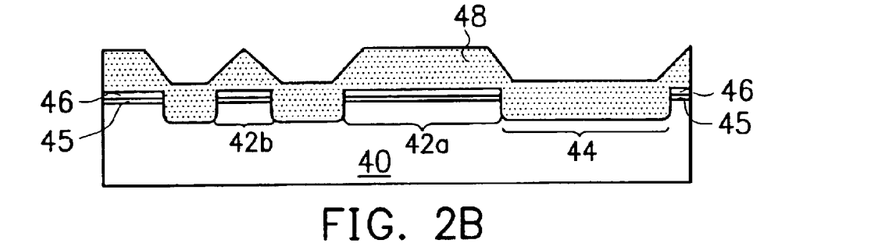

Referring to FIG. 2A, active regions 42a, 42b are defined on a substrate 40 first by depositing a pad oxide layer 45 and a silicon nitride layer 46, and then by photolithography and trench etching to form shallow trenches 44 between the active regions 42a, 42b. The sizes of the shallow trenches are varied since the sizes of the active regions 42a, 42b are different. Then, a silicon oxide layer 48 is deposited over the substrate 40 and filling the trenches 44, preferably by high density plasma chemical vapor deposition (HDPCVD). The profile of the silicon oxide layer 48 on the active region 42a, 42b is at a higher level than that of the silicon oxide layer 48 on the shallow trenches 44 since the shallow trenches are fallen in the substrate 40. The HDPCVD oxide layer 48 on the active region 42a, 42b has a sharp profile, as shown in FIG. 2B, which is different from the conventional.

Figure 2C:
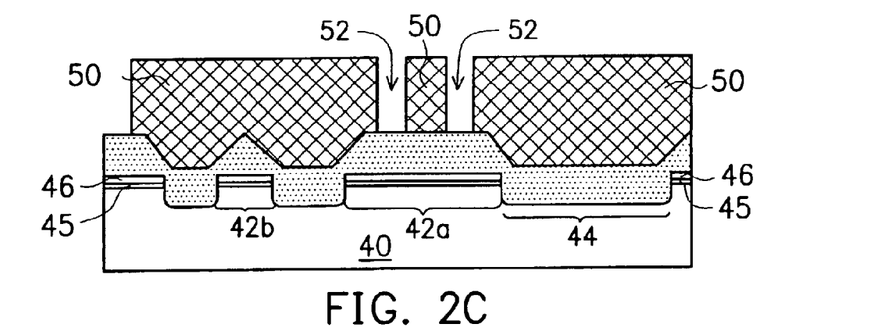

Referring to FIG. 2C, a photoresist layer is coated on the oxide layer 48 and defined to form a partial reverse active mask 50 by photolithography. The partial reverse active mask 50 has an opening 52 at the central part of the larger active region 42a. Since the opening 52 exposes only the central part of the silicon oxide layer 48 at the larger active region 42a, the silicon oxide layer 48 over the shallow trenches 44 will not be exposed even though misalignment occurs.

Figure 2D:
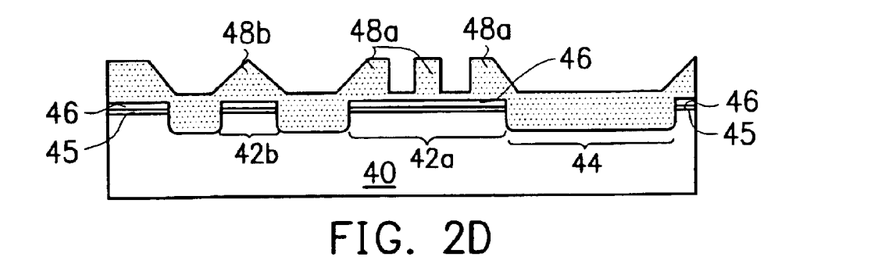

Referring to FIG. 2D, using the reverse active mask 50 as a mask, the exposed silicon oxide layer 48 at the larger active region 42a is etched back until the silicon nitride layer 46 is exposed. The reverse active mask is then peeled. Then, only the oxide layer 48b on the smaller active region 42b and a small portion of the silicon oxide layer 48a through etching back on the larger active region 42a remain. The remaining silicon oxide layer 48a and 48b formed preferably by HDPCVD have sharp profiles and are therefore easy to be planarized by CMP. Also, the sizes of the remained silicon oxide layer 48a and 48b are more or less similar so that the consistency of CMP is increased.

Figure 2E:
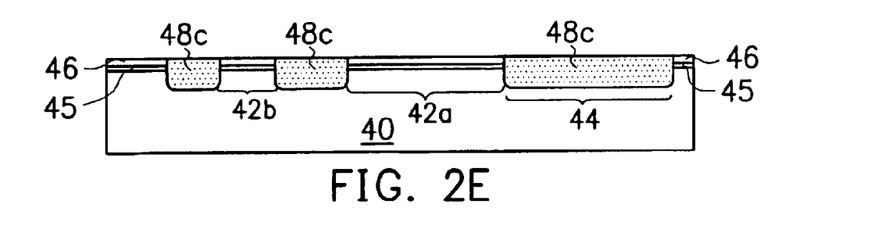

Next, referring to FIG. 2E, the remained silicon oxide layer 48a and 48b (as shown in FIG. 2D) are polished by CMP, using the silicon nitride layer 46 as an etching stop layer so that the silicon oxide layer 48c in the shallow trenches and the silicon nitride layer 46 are almost at the same level.

Figure 3A:
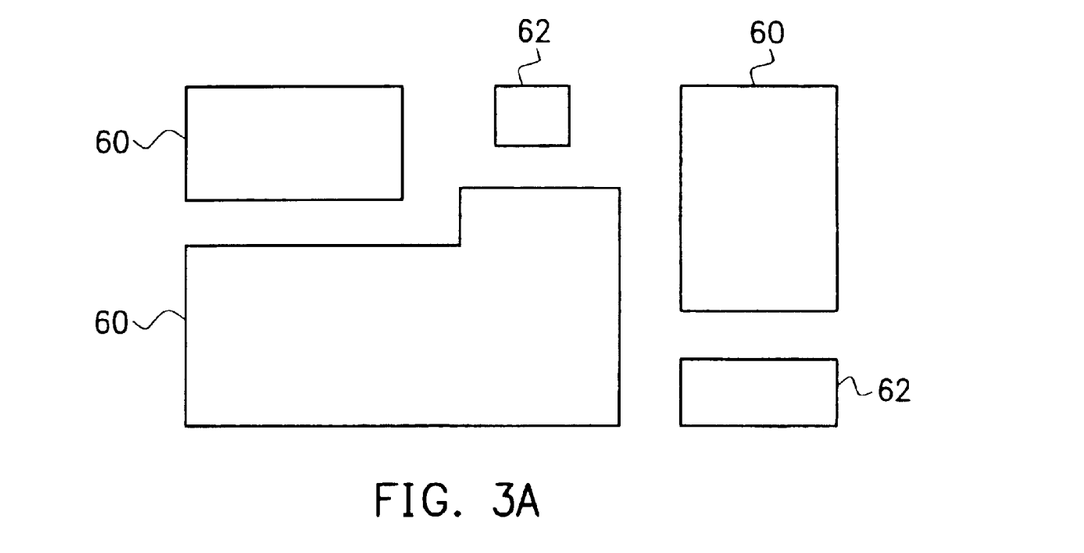
FIGS. 3A to 3D illustrate the partial reverse active mask according to a preferred embodiment of the invention.

In the above embodiment, a partial reverse active mask is employed for forming a shallow trench isolation. In FIGS. 3A to 3D, a method of forming a partial reverse active mask is shown. As shown in FIG. 3A, to define a photomask pattern, active regions are formed first. The active regions include a larger active region pattern 60 and a smaller active region pattern 62.

Figure 3B:
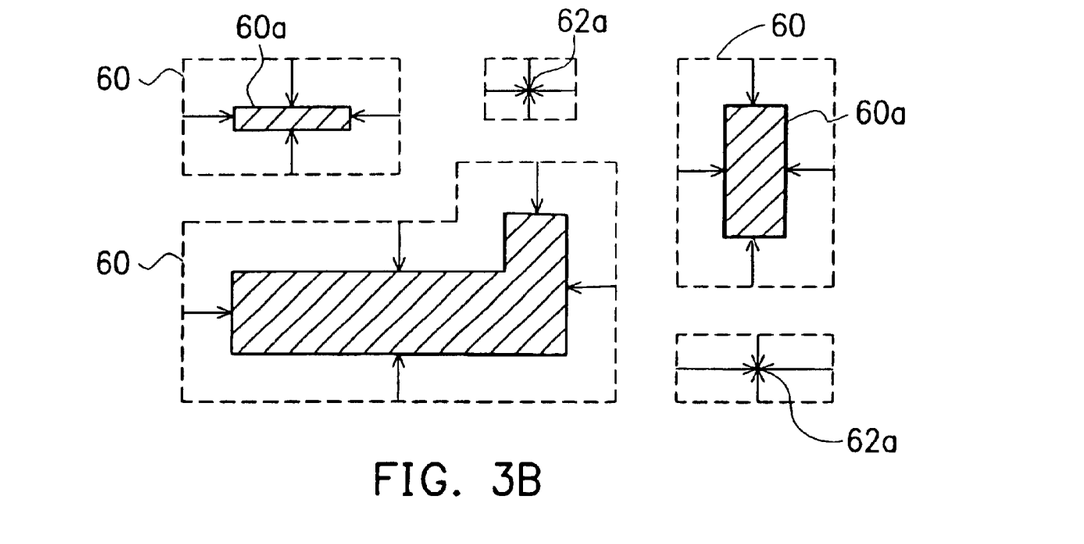

Referring to FIG. 3B, the larger active region pattern 60 and the smaller active pattern region 62 are shrunk as shown in the figure. The shrinking larger active region pattern and the shrinking smaller active region pattern are denoted as 60a and 62a respectively.

Figure 3C:
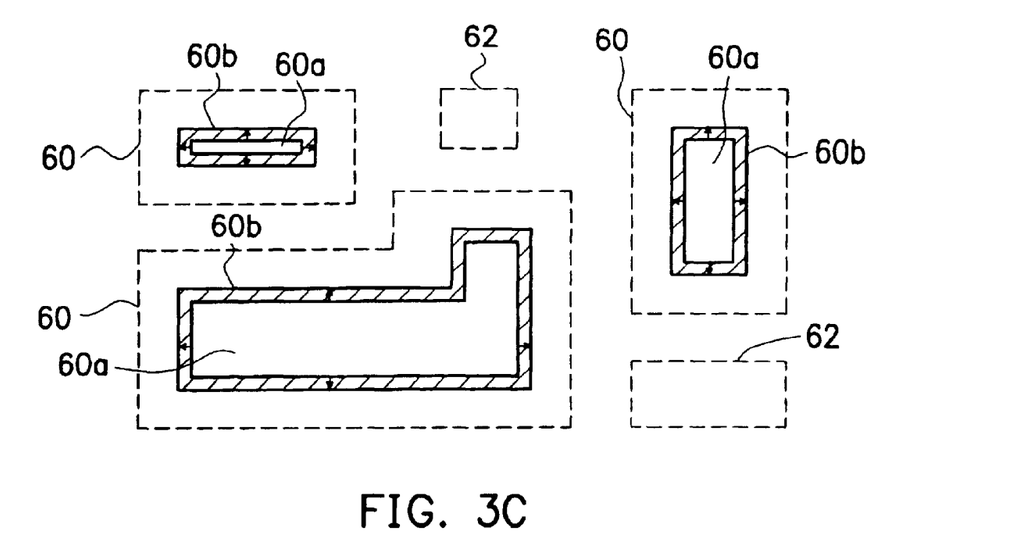

Referring to FIG. 3C, the shrinking process is continued until the shrinking smaller active region pattern 62a disappears. The shrinking distance is about 0.5 µm to 2 µm each side so that active region patterns with maximum radius of less than 0.1~0.4 µm will disappear. Next, the shrinking larger active region 60a is enlarged until the profile of it is a little bit smaller than the profile of the original larger active region pattern. The profile of the larger active region pattern at the stage is denoted as 60b. The shrinking large active region pattern 60a is enlarged with a dimension of about 0.2 µm to 2 µm each side. This enlarged dimension is smaller than the shrinking distance mentioned above.

Figure 3D:
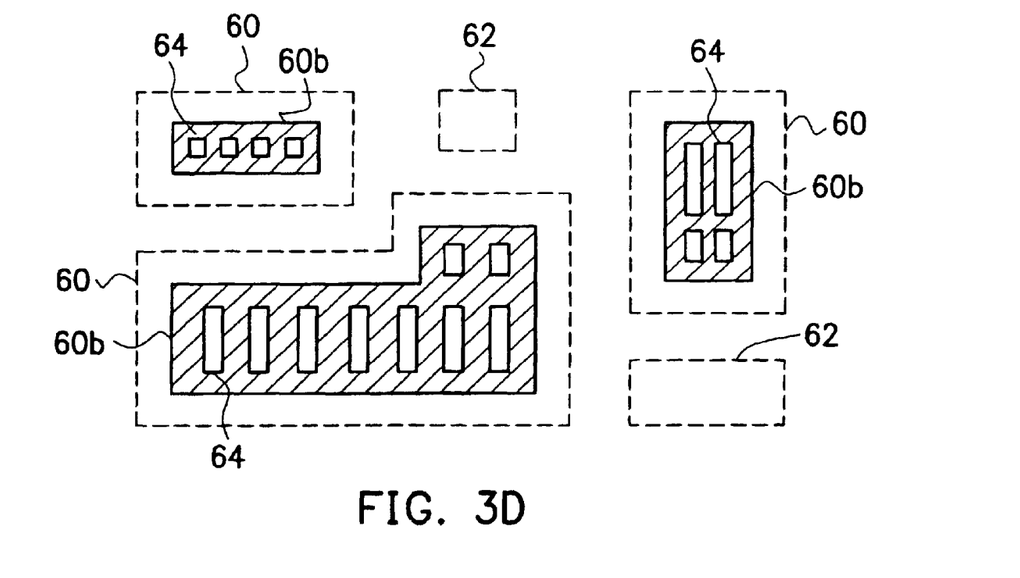

Referring to FIG. 3D, the partial reverse active mask 60b is located at the central part of the larger active region 60 but slightly smaller than the larger active region. One characteristic of the present invention is that the partial reverse active mask pattern 60b at the larger active region 60 has dummy pattern 64 so that dishing effect at the larger active region 60 can be avoided. By applying this photomask pattern in forming a shallow trench isolation, the central part of an active region is exposed, whereas the edge part of the active region is covered by a photo-resist. A partial reverse active mask pattern is thus obtained.

It will be appreciated by one of skill in the art that the reverse partial active mask techniques described hereinabove may be used to facilitate etching oxide from an alignment mark in the substrate. This removes the oxide from the alignment so that a CMP process over the alignment mark is unnecessary. Thus, the alignment mark is clearly exposed without the need for additional steps.

Figure 4A:
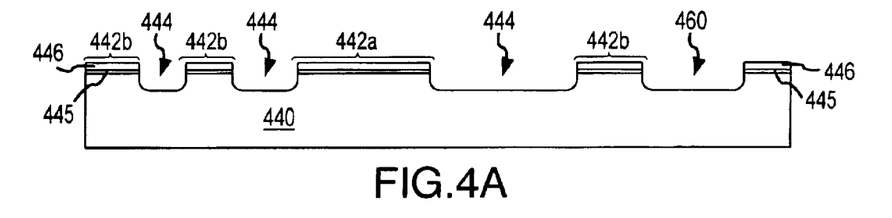
FIGS. 4A TO 4E are cross-sectional views showing the process steps of forming shallow trenches and maintaining an alignment mark using a partial reverse active mask according to another embodiment of the invention.
Figure 4B:
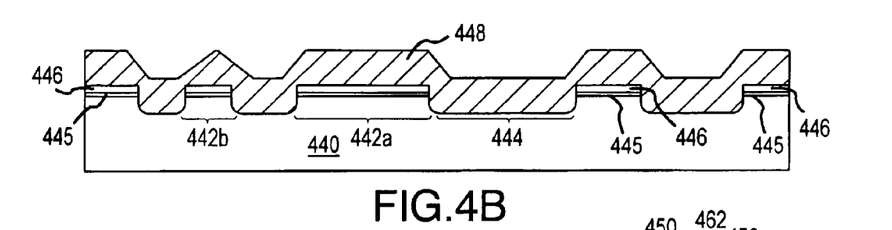

This is illustrated in FIGS. 4A to 4E, which demonstrate the use of a reverse partial active mask technique to etch oxide from an alignment mark in the substrate. In an exemplary embodiment, an alignment mark may be a shallow trench formed in the substrate. Referring to FIG. 4A, active regions 442a, 442b are defined on a substrate 440 first by depositing a pad oxide layer 445 and a silicon nitride layer 446, and then by photolithography and trench etching to form shallow trenched 444 between the active regions 442a, 442b. In addition, an alignment mark 460 is formed in the substrate 440. The sizes of the shallow trenches may be varied since the sizes of the active regions 442a, 442b may be different. Then, a silicon oxide layer 448 is deposited over the substrate 440 and filling the trenches 444 and the alignment mark 460, preferably by high density plasma chemical vapor deposition (HDPCVD). The profile of the silicon oxide layer 448 on the active region 442a, 442b may be at a higher level than that of the silicon oxide layer 448 on the shallow trenches 444 and alignment mark 460, since the shallow trenches 444 and alignment mark 460 follows the contour of the substrate 440. The HDPCVD oxide layer 448 on the active region 442a, 442b may have a sharp profile, as shown in FIG. 4B, which is different from the conventional.

Figure 4C:
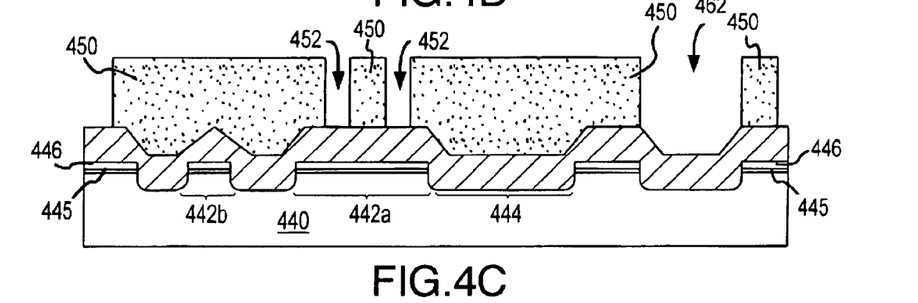

Referring to FIG. 4C, a photoresist layer is coated oh the oxide layer 448 and defined to form a partial reverse active mask 450, e.g., by photolithography. The partial reverse active mask 450 may have an opening 452, e.g., near the central part of the larger active region 442a. Since, in one exemplary embodiment, the opening 452 exposes only the central part of the silicon oxide layer 448 of the larger active region 442a, the silicon oxide layer 448 over the shallow trenches 444 will not be exposed even though misalignment occurs. In addition, the partial reverse mask 450 may have an opening 462 over at least a portion of the alignment mark 460.

Figure 4D:
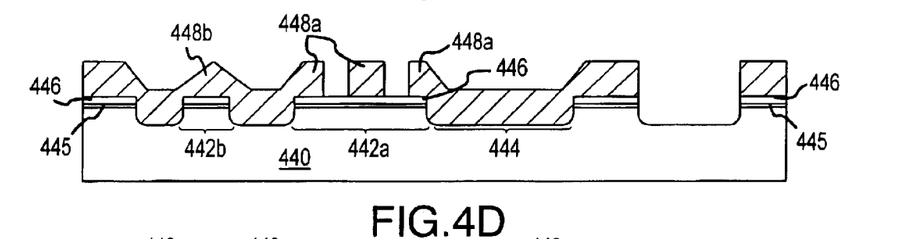

Referring to FIG. 4D, using the reverse active mask 450 as a mask, the exposed silicon oxide layer 448 at the larger active region 442a is etched back until the silicon nitride layer 446 is exposed. The reverse active mask 450 may then be peeled. Then, only the oxide layer 448b on the smaller active region 442b and a small portion of the silicon oxide layer 448a through etching back on the larger active region 442a remain. The remaining silicon oxide layer 448a and 448b, which may be formed by high-density plasma chemical vapor deposition (HDPCVD) have sharp profiles and therefore are easy to planarize by CMP. Also, the sizes of the remained silicon oxide layer 448a and 448b are more or less similar so that the consistency of CMP is increased.

Figure 4E:
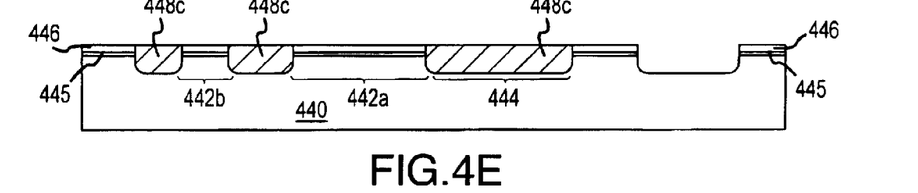

Next, referring to FIG. 4E, the remained silicon oxide layer 448a and 448b (as shown in FIG. 4D) are polished by, e.g., CMP, using the silicon nitride layer 446 as an etching stop layer so that the silicon oxide layer 448c in the shallow trenches and the silicon nitride layer 446 are almost at the same level.

Advantages of the invention include:

(1) The oxide layer formed by HDCVD has a pyramid-like profile, so that using chemical-mechanical polishing, the oxide layer is planarized easily.

(2) Using a partial reverse active mask to etch away the oxide layer on the central part of an active region, only the oxide layer on the edge part of the active region and on a small active region is remained. The profile of the remaining oxide layer is pyramid-like and has a better uniformity. Therefore, a recess formed while polishing a large trench is avoided.

(3) The dishing effect on the large active region is avoided since the partial reverse active mask has a dummy pattern.

(4) Since only the oxide layer on the central part of an active region is etched away by using a partial reverse active mask, even when a misalignment occurs, the oxide layer within the trench is not etched. The kink effect is prevented. As a consequence, the current leakage and the short circuit caused by kink effect are avoided, so that the yield of wafer is enhanced.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

The words "comprise," "comprising," "include," "including," and "includes" when used in this specification and in the following claims are intended to specify the presence of stated features, integers, components, or steps, but they do not preclude the presence or addition of one or more other features, integers, components, steps, or groups.

We claim:

1. A method of chemical-mechanical polishing for forming a shallow trench isolation, wherein a substrate having a plurality of active regions, including a plurality of relatively large active regions and a plurality of relatively small active regions and an alignment mark, is provided, the method comprising the steps of:

forming a plurality of shallow trenches between the active regions;

forming an oxide layer over the substrate, so that the shallow trenches and the alignment mark are filled therewith;

forming a partial reverse active mask on the oxide layer, wherein the partial reverse active mask has an opening at each relatively large active region and at the alignment mark when the reverse active mask completely covers each relatively small active region and trenches, wherein the opening exposes a portion of the oxide layer, and wherein the opening comprises a dummy pattern including at least one protrusion portion in the opening;

removing portions of the oxide layer on each large active region and at the alignment mark;

removing the partial reverse active mask; and planarizing the oxide layer after removing the partial reverse active mask.

2. The method of claim 1, wherein the shallow trenches are formed by photolithography and etching.

3. The method of claim 1, wherein the oxide layer is formed by high density plasma chemical vapor deposition.

4. The method of claim 1, wherein the exposed portion of the oxide layer is removed by anisotropic etching.

5. The method of claim 1, further comprising forming a silicon nitride layer on the substrate before said forming of the oxide layer.

6. The method of claim 5, wherein the exposed portion of the oxide layer is removed, using the silicon nitride layer as an etching stop layer.

7. The method of claim 1, wherein the oxide layer is planarized by chemical mechanical polishing.

8. A method of chemical-mechanical polishing in forming a multi-layered semiconductor device comprising a substrate, comprising:

forming an alignment mark in the substrate and a plurality of shallow trenches between active regions of the semiconductor substrate;

forming an oxide layer over the substrate;

forming a partial reverse active mask on the oxide layer, wherein the partial reverse active mask has an opening over a portion of at least one active region and over the alignment mark, wherein the portion of the at least one active region is less than all of the at least one active region, and wherein the opening comprises a dummy pattern including at least one protrusion portion in the opening;

removing portions of the oxide layer over the portion of the at least one active region and over portions of the alignment mark;

removing the partial reverse active mask; and planarizing the oxide layer after removing the partial reverse active mask.

9. The method of claim 8, wherein forming the alignment mark comprises forming another shallow trench in the substrate.

10. The method of claim 8, wherein the shallow trenches are formed by photolithography and etching.

11. The method of claim 8, wherein the oxide layer is formed by high density plasma chemical vapor deposition.

12. The method of claim 8, wherein the portions of the oxide layer are removed by anisotropic etching.

13. The method of claim 8, further comprising forming a silicon nitride layer on the substrate before said forming of the oxide layer.

14. The method of claim 13, wherein exposed portions of the oxide layer are removed using the silicon nitride layer as an etching stop layer.

15. The method of claim 8, wherein the oxide layer is planarized by chemical mechanical polishing.

16. A method of forming a semiconductor device having an alignment mark, comprising:

forming an alignment mark in a substrate;

forming at least one large active area and at least one small active area on the substrate;

forming an oxide layer over the substrate, wherein the oxide layer covers at least a portion of the alignment mark;

forming a partial reverse active mask on the oxide layer, wherein the partial reverse active mask has an opening over at least a portion of the alignment mark when the reverse active mask completely covers the at least one small active area, and wherein the opening comprises a dummy pattern including at least one protrusion portion in the opening;

removing portions of the oxide layer;

removing the partial reverse active mask; and planarizing the oxide layer after removing the partial reverse active mask.

17. The method of claim 16, wherein forming an alignment mark comprises forming a shallow trench in the substrate.

18. The method of claim 17, wherein the shallow trench is formed by photolithography and etching.

19. The method of claim 17, wherein the oxide layer is formed by high density plasma chemical vapor deposition.

20. The method of claim 16, wherein the portions of the oxide layer are removed by anisotropic etching.

21. The method of claim 16, further comprising forming a silicon nitride layer on the substrate before said forming of the oxide layer.

22. The method of claim 21, wherein exposed portions of the oxide layer are removed using the silicon nitride layer as an etching stop layer.

23. The method of claim 16, wherein the oxide layer is planarized by chemical mechanical polishing.

* * * * *

UNITED STATES PATENT AND TRADEMARK OFFICE
CERTIFICATE OF CORRECTION

PATENT NO. : 6,790,742 B2  
DATED : September 14, 2004  
INVENTOR(S) : Ming-Sheng Yang, Juan-Yuan Wu and Water Lur It is certified that error appears in the above-identified patent and that said Letters Patent is hereby corrected as shown below:

<u>Title page,</u>
Item [73], Assignee, delete "San Francisco, CA (US)" and substitute -- Hsinchu City, Taiwan R.O.C. --.

Signed and Sealed this

Twenty-first Day of March, 2006

JON W. DUDAS
*Director of the United States Patent and Trademark Office*